(12) United States Patent
Huang (10) Patent No.: US 12,342,499 B2
(45) Date of Patent: Jun. 24, 2025

(54) LIQUID COOLING RADIATOR WITH AIR BARRIER SPACE BETWEEN BENDING PARTITIONS

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 285 days.

(21) Appl. No.: 18/137,996

(22) Filed: Apr. 21, 2023

(65) Prior Publication Data

US 2024/0334645 A1 Oct. 3, 2024

(30) Foreign Application Priority Data

Mar. 31, 2023 (TW) ................... 112112565

(51) Int. Cl.
*H05K 7/20* (2006.01)
*F28D 1/053* (2006.01)
*G06F 1/20* (2006.01)

(52) U.S. Cl.
CPC ..... *H05K 7/20272* (2013.01); *F28D 1/05391* (2013.01); *H05K 7/20263* (2013.01); *H05K 7/20772* (2013.01); *G06F 1/20* (2013.01)

(58) Field of Classification Search
CPC ..... G06F 1/20; F28D 1/05391; H01L 23/473; H05K 7/20009; H05K 7/20136; H05K 7/20154; H05K 7/20218; H05K 7/20254; H05K 7/20263; H05K 7/20272; H05K 7/20627; H05K 7/20763; H05K 7/20772
See application file for complete search history.

(56) References Cited

U.S. PATENT DOCUMENTS

| 11,137,175 B2* | 10/2021 | Lan | H05K 7/20263 |
| 2005/0051317 A1* | 3/2005 | Chin | F28D 1/05391 |
| | | | 165/177 |
| 2009/0044929 A1* | 2/2009 | Yeh | F28D 15/00 |
| | | | 165/104.19 |

FOREIGN PATENT DOCUMENTS

| CN | 214708446 U | * 11/2021 | ......... F28D 1/05375 |
| CN | 215113450 U | * 12/2021 | ........... F04D 29/426 |
| CN | 116540853 A | * 8/2023 | ............... G06F 1/20 |

OTHER PUBLICATIONS

Machine translation completed Mar. 26, 2025, CN 215113450-U by Huang (Year: 2025).*

* cited by examiner

*Primary Examiner* — Timothy J Thompson
*Assistant Examiner* — Steven Ngo
(74) *Attorney, Agent, or Firm* — Ying-Ting Chen; Law Office of Michael Chen (57) ABSTRACT

A liquid cooler includes a liquid cooling head, a liquid cooling radiator and liquid delivery pipes connected between the liquid cooling head and the liquid cooling radiator. The liquid cooling radiator has a liquid pump box, a heat dissipation pipe set and a liquid return box. The liquid pump box is divided into a hot liquid chamber and a cold liquid chamber by an air barrier space. The space of the hot liquid chamber is smaller than that of the cold liquid chamber, so that the hot liquid quickly enters the heat dissipation pipe set through the liquid pump box and overcomes the problems that the hot liquid in the liquid pump box is easy to accumulate heat and conduct heat to the cold liquid.

9 Claims, 8 Drawing Sheets

LIQUID COOLING RADIATOR WITH AIR BARRIER SPACE BETWEEN BENDING PARTITIONS

BACKGROUND OF THE INVENTION

(a) Field of the Invention

The present invention relates to the technical field of liquid cooling and heat dissipation of servers, in particular to a liquid cooler suitable for dissipating heat from a processor installed in a server.

(b) Description of the Prior Art

Nowadays, the processor of the server tends to heat up when it is running. The conventional air-cooled heat dissipation device is no longer sufficient. Instead, a liquid cooling system with better cooling efficiency is used. The conventional liquid cooling system includes a liquid cooling head, a liquid cooling radiator, a liquid pump and liquid pipes to form a closed liquid circulation system. Wherein, the liquid cooling radiator has a shunt box, a return box, and a heat dissipation pipe connected between the shunt box and the return box. Usually, the inside of the shunt box is divided into a liquid inlet chamber for hot liquid and a liquid outlet chamber for cold liquid. When the above-mentioned liquid pump is running, it drives the working fluid to flow through the liquid cooling head to cool down the processor, and the working fluid generates temperature and becomes a hot liquid. After the hot liquid enters the liquid inlet chamber of the shunt box of the liquid cooling radiator, it then flows through half of the heat dissipation pipes, the return box and the other half of the heat dissipation pipes to the liquid outlet chamber. At this time, the hot liquid has dissipated heat and becomes a cold liquid, which can then flow to the liquid cooling head to cool the processor.

But the above-mentioned hot liquid will conduct heat to the cold liquid in the liquid outlet chamber through the metal partition when it enters the liquid chamber, causing the cooled cold liquid to be heated again. Moreover, the space of the conventional liquid inlet chamber is the same size as the liquid outlet chamber, so that the hot liquid cannot quickly flow through the liquid inlet chamber to the heat dissipation pipes, causing the heat of the hot liquid to be accumulated in the shunt box and then conducted to the front end of the entire water cooling radiator (including the front end of the heat dissipation pipes), so that the cooled liquid is heated when it flows through. Therefore, how to solve its defective, is the problem that the present invention will actively solve. In addition, the conventional heat dissipation pipes have a plurality of flat pipes and wavy heat dissipation fins combined on both sides of the flat pipes. The wavy heat dissipation fins and the surface of the flat pipes only have a partial line contact state, which affects the heat conduction efficiency between the flat pipes and the heat dissipation fins, and reduces the heat dissipation effect, which is also the subject to be overcome by the present invention.

SUMMARY OF THE INVENTION

The main object of the present invention is to provide a liquid cooler. Through the structural design of the liquid pump box in the liquid cooling radiator, the liquid pump box is divided into a hot liquid inlet chamber and a cold liquid outlet chamber by using an air barrier space, a hot liquid bending partition and a cold liquid bending partition. The space of the hot liquid inlet chamber is smaller than that of the cold liquid outlet chamber, so that the hot liquid flowing into the liquid pump box can quickly pass through and flow to the heat dissipation pipe set to dissipate heat, avoiding heat accumulation of the hot liquid in the liquid pump box. And through the air barrier space design, the heat of the hot liquid flowing into the liquid pump box is blocked by the air barrier space, and the heat cannot be transferred to the cold liquid. In this way, it can prevent heat accumulation in the liquid pump box and prevent hot liquid from being transferred to cold liquid in the liquid pump box.

The second object of the present invention is to provide a liquid cooler, which, through the structural design of two rows of flat pipes in the heat dissipation pipe set and the heat dissipation fins welded on the surface of the two rows of flat pipes, can Make the hot liquid circulating in the flat pipes transfer heat to the heat dissipation fins faster, to achieve improved cooling efficiency and the effects of using heat dissipation fins to fix the heat dissipation pipe set to improve structural stability.

Still another object of the present invention is to provide a liquid cooler, which makes the liquid cooler of the present invention more suitable for server use through the design of the spatial relationship between the air inlet and air outlet of the heat dissipation pipe set relative to the liquid pump box.

DETAILED DESCRIPTION OF THE PREFERRED EMBODIMENTS

Figure 1:
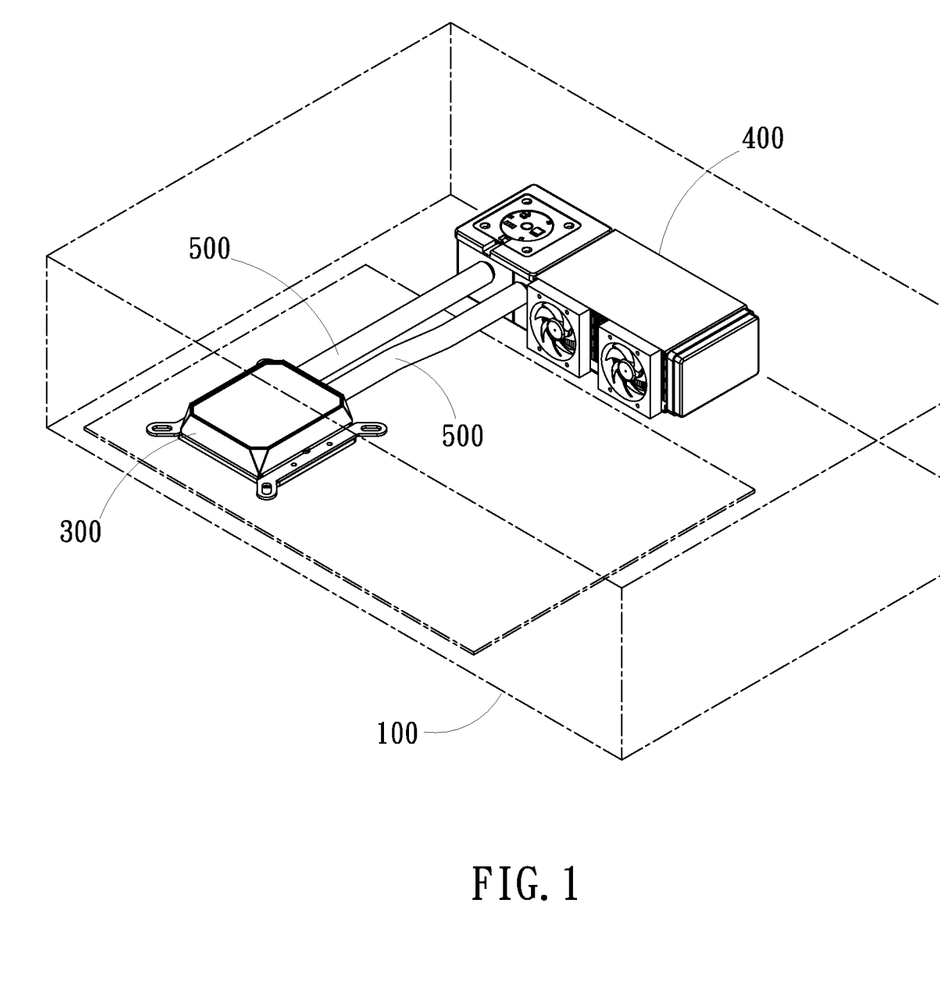
FIG. 1 is a schematic diagram of a liquid cooler of the present invention installed on a rack server.
Figure 2:
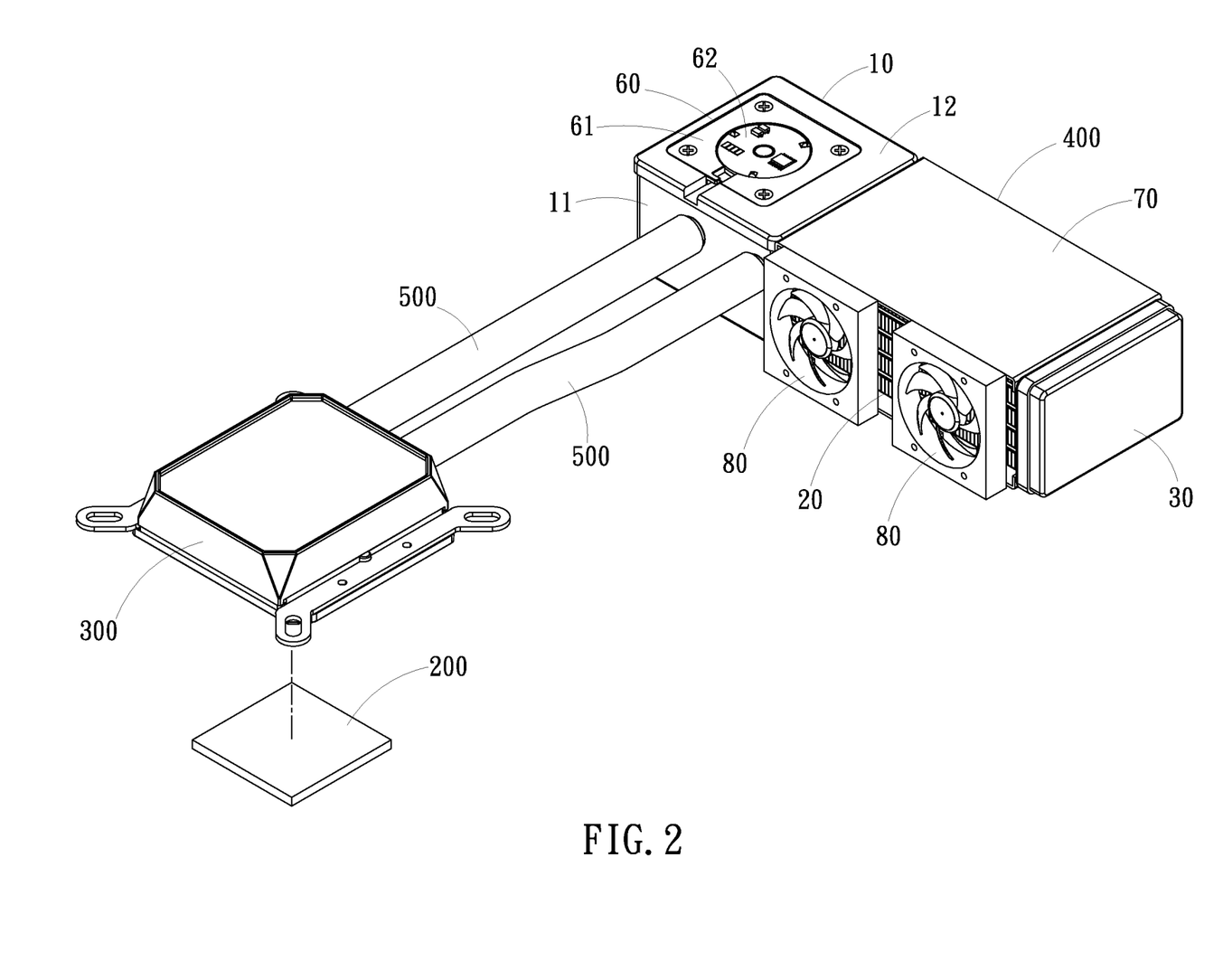
FIG. 2 is a schematic diagram of the combination of the liquid cooler of the present invention.

As shown in FIG. 1 and FIG. 2, a liquid cooler of the present invention is a separate liquid cooling heat dissipation system suitable for being installed in a server 100 to dissipate heat from a processor 200. Its preferred specific embodiment comprises a liquid cooling head 300 arranged on a processor 200, a liquid cooling radiator 400 separated from the liquid cooling head 300 for heat dissipation, and two liquid delivery pipes 500 connected between the liquid cooling head 300 and the liquid cooling radiator 400.

The liquid cooling head is an existing device. After connecting the two liquid delivery pipes 500 to the liquid cooling head 300, the cold liquid of the liquid cooling radiator 400 can flow from one liquid delivery pipe 500 into the liquid cooling head 300 to cool the heat of the processor 200, and the cold liquid is converted into hot liquid through heat exchange, and then flows from the other liquid delivery pipe 500 to the liquid cooling radiator 400, through which the liquid cooling radiator 400 dissipates heat and then cools down to become cold liquid. The two liquid delivery pipes 500 can be plastic hoses, acrylic hard pipes, or copper pipes, etc., and are used to deliver cold liquid and hot liquid.

Figure 3:
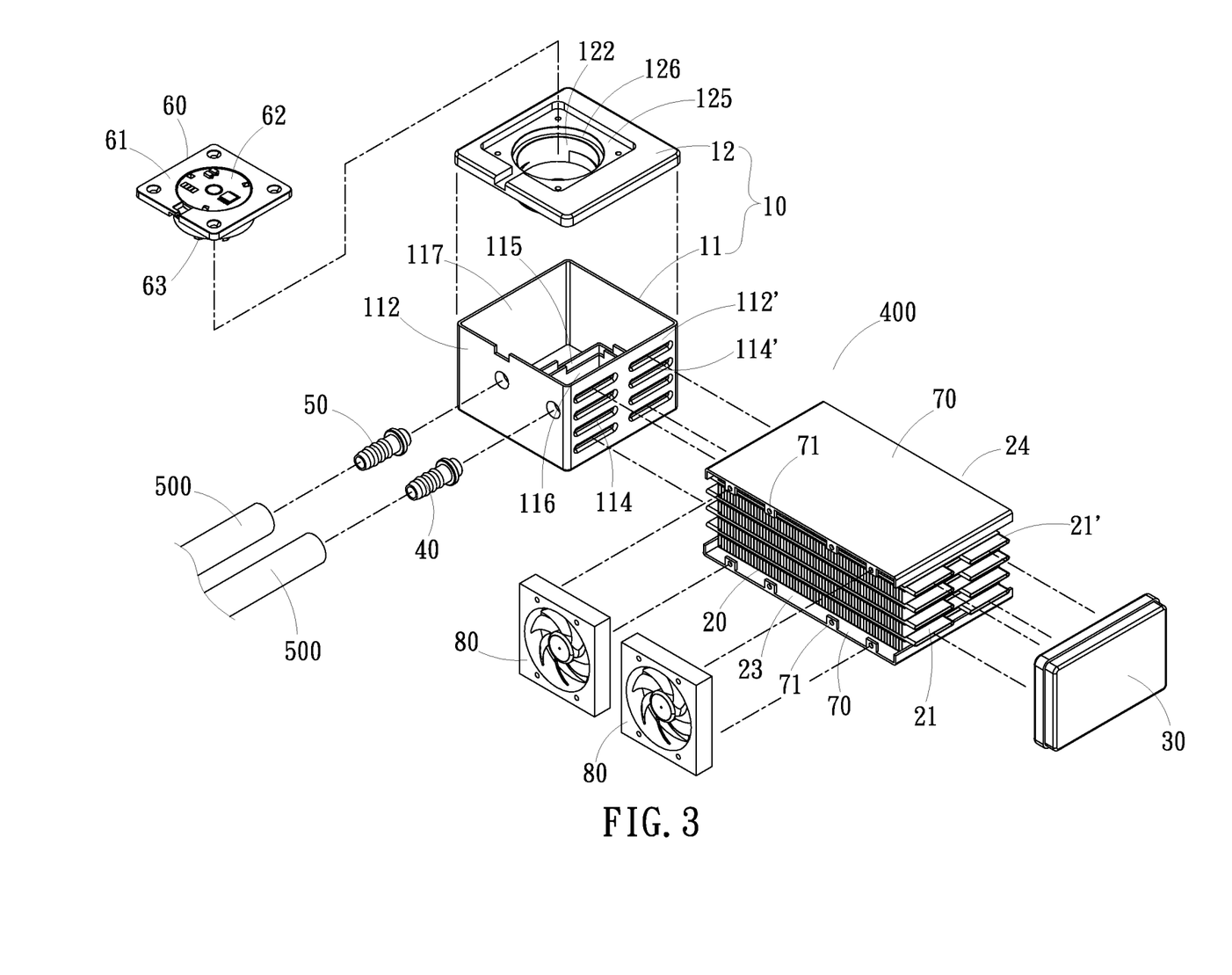
FIG. 3 is an exploded schematic diagram of the liquid cooler of the present invention.

As shown in FIG. 3, the liquid cooling radiator 400 of the present invention comprises a liquid pump box 10, a heat dissipation pipe set 20 and a liquid return box 30. The liquid pump box 10 comprises a rectangular box body 11 and a box cover 12 made of aluminum alloy with better heat dissipation. The box body 11 is integrally formed with a bottom wall 111, surrounding side walls 112, 112' and an opening 113. The left or right-side wall 112' of the box body 11 is provided with two rows of vertically arranged pipe jacks 114, 114', the pipe jacks 114, 114' are strip holes extending horizontally and connected to the inside of the box body 11. The box cover 12 covers the opening 113 of the box body 11, sealing the opening 113. The heat dissipation pipe set 20 is made of aluminum alloy and comprises two rows of vertically arranged flat pipes 21, 21', and a plurality of heat dissipation fins 22 welded on the upper and lower planes of the flat pipes 21, 21'. The flat pipes 21, 21' have respective one ends thereof inserted and welded to the pipe jacks 114, 114' on one side of the box body 11 respectively, and respective opposite ends thereof inserted and welded to the liquid return box 30. The internal space of the liquid return box 30 is unobstructed, so that the hot liquid flows into the liquid return box 30 through a row of flat pipes 21 in the heat dissipation pipe set 20, and then flows from the liquid return box 30 to another row of flat pipes 21' in the heat dissipation pipe set 20, and then returns to the liquid pump box 10.

Figure 4:
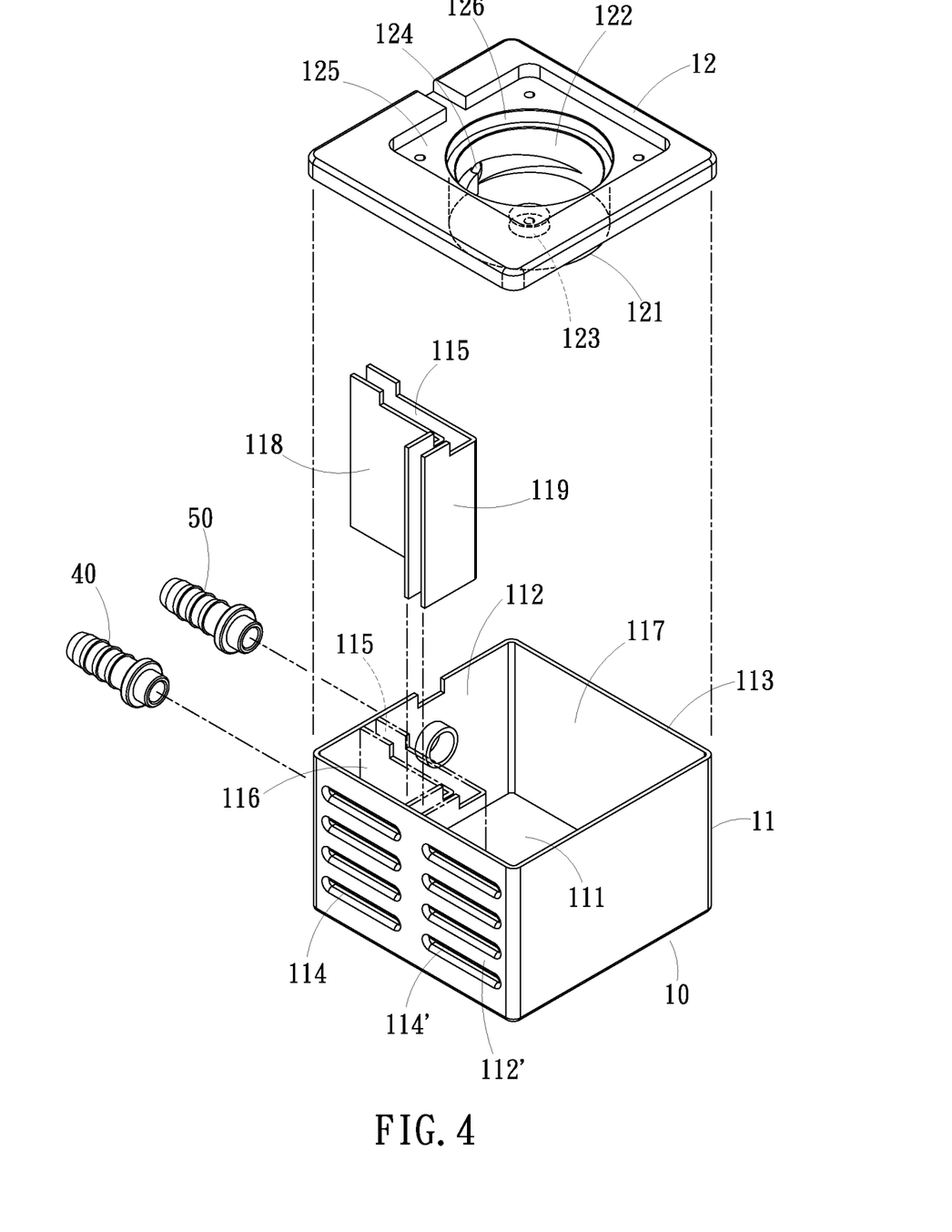
FIG. 4 is an exploded schematic diagram of the liquid pump box of the present invention.
Figure 6:
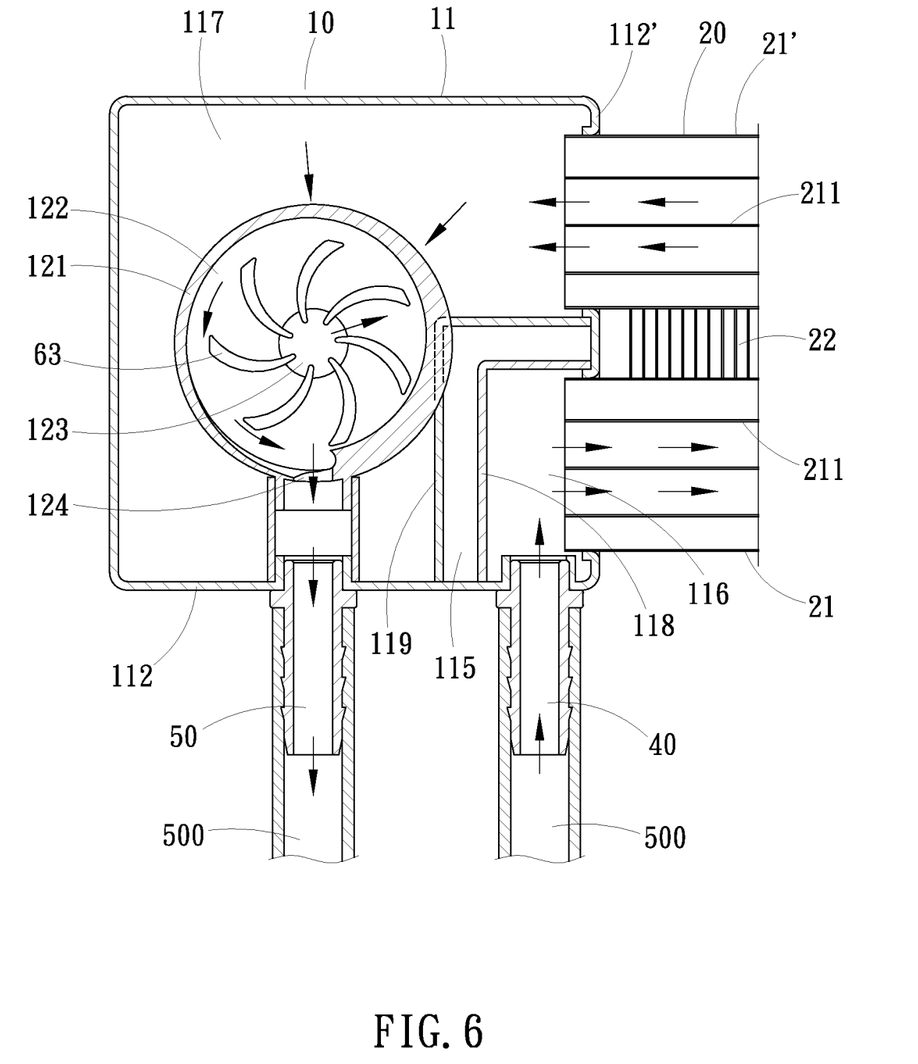
FIG. 6 is a schematic diagram of hot liquid and cold liquid flowing through the liquid pump box of the present invention.

As shown in FIG. 4 and FIG. 6, an air barrier space 115 is specially implemented inside the box body 11 of the present invention. One end of the air barrier space 115 is adjacent to the inner surface of the front side wall 112 of the box body 11, and the other end is bent and adjacent to the inner surface of the left or right-side wall 112' of the box body 11 and is located between the two rows of pipe jacks 114, 114'. The lower end of the air barrier space 115 is adjacent to the inner surface of the bottom wall 111, and the opposite upper end is adjacent to the inner surface of the box cover 12. In this way, the inside of the box body 11 is divided into a hot liquid inlet chamber 116 and a cold liquid outlet chamber 117 by the air barrier space 115. The space of the hot liquid inlet chamber 116 must be smaller than the space of the cold liquid outlet chamber 117, so that the hot liquid in the hot liquid inlet chamber 116 can pass through quickly. The hot liquid inlet chamber 116 is connected to one row of pipe jacks 114, and the cold liquid outlet chamber 117 is connected to another row of pipe jacks 114'. The hot liquid inlet chamber 116 and the cold liquid outlet chamber 117 are not connected to the air barrier space 115. Also, the front side wall 112 of the box body 11 is provided with a liquid inlet pipe 40 connected to the hot liquid inlet chamber 116, and a liquid outlet pipe 50 connected to the cold liquid outlet chamber 117.

The above preferred embodiment of the air barrier space 115 comprises a hot liquid bending partition 118 and a cold liquid bending partition 119 arranged apart. The hot liquid bending partition 118 and the cold liquid bending partition 119 are respectively an L-shaped bending partition made of aluminum alloy stamping. When it is assembled inside the box body 11, one ends of the hot liquid bending partition 118 and the cold liquid bending partition 119 are respectively welded to the inner surface of the front side wall 112 of the box body 11, and the other ends are respectively welded to the inner surface of the left or right side wall 112' of the box body 11 and between the two rows of pipe jacks 114, 114'.

The bottom ends of the hot liquid bending partition 118 and the cold liquid bending partition 119 are respectively welded to the inner surface of the bottom wall 111 of the box body 11. Accordingly, the air barrier space 115 is formed as an L-shaped bending space between the hot liquid bending partition 118 and the cold liquid bending partition 119. When the above-mentioned box cover 12 covers the opening 113 of the box body 11, it seals the air barrier space 115, hot liquid inlet chamber 116 and cold liquid outlet chamber 117, so that the inner surface of the box cover 12 is closely connected with the upper ends of the hot liquid bending partition 118 and the cold liquid bending partition 119.

As shown in FIG. 6, the present invention divides the box body 11 into the hot liquid inlet chamber 116 and the cold liquid outlet chamber 117 through the air barrier space 115, hot liquid bending partition 118 and cold liquid bending partition 119 of the liquid pump box 10 above. The space of the hot liquid inlet chamber 116 must be smaller than that of the cold liquid outlet chamber 117, so that the hot liquid flows into the hot liquid inlet chamber 116 through the liquid inlet pipe 40 and must quickly flow into one row of flat pipes 21 of the heat dissipation pipe set 20 due to insufficient space, thereby realizing the rapid flow of hot liquid to the heat dissipation pipe set 20 to dissipate heat to prevent the hot liquid from accumulating heat in the liquid pump box 10. Furthermore, through the design of the air barrier space 115, the thermal conductivity of air is only 2~25 h $(W/m^2 \cdot K)$, while the thermal conductivity of aluminum alloy is about 130~150 h $(W/m^2 \cdot K)$, which can block the heat conduction of the hot liquid inlet chamber 116 to the cold liquid in the cold liquid outlet chamber 117, preventing the cold liquid from being heated up before it flows out.

Figure 5:
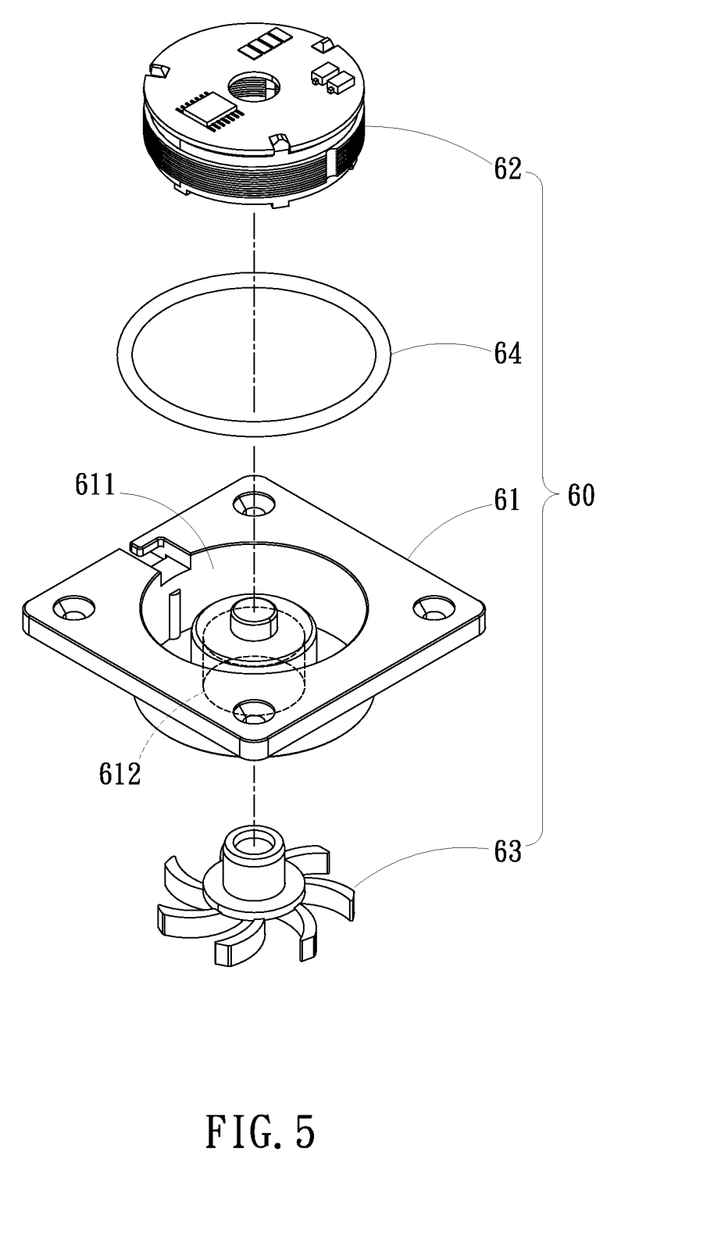
FIG. 5 is an exploded schematic diagram of the liquid pump of the present invention.

As shown in FIG. 3 and FIG. 5, the liquid pump box 10 of the present invention can be provided with a liquid pump 60, and the liquid pump 60 is arranged inside the box body 11 or inside the box cover 12 of the liquid pump box 10. In one specific embodiment, a liquid pump seat 121 protrudes from the inner surface of the box cover 12, and a liquid pump installation cavity 122 is recessed from the outer surface of the box cover 12 to the liquid pump seat 121. The end face of the liquid pump installation cavity 122 is provided with a liquid inlet hole 123 connected to the cold liquid outlet chamber 117, and the side of the liquid pump installation cavity 122 is provided with a liquid outlet hole 124 connected to the liquid outlet pipe 50. The liquid pump 60 comprises a liquid pump cover 61, a motor stator 62, an impeller rotor 63 and a sealing ring 64. The liquid pump cover 41 is embedded in a mounting groove 125 on the outside of the box cover 12, the outer surface of the liquid pump cover 61 has a ring groove 611 concave to its inner surface, and the inner surface of the liquid pump cover 61 has a concave hole 612 concave to its outer surface, and the concave hole 612 is coaxial with the ring groove 611. The motor stator 62 is set in the outer ring groove 611 and closes the ring groove 611. The impeller rotor 63 is set in the inner concave hole 612, so that the motor stator 62 can drive the impeller rotor 63 to rotate in the liquid pump installation cavity 122 through the liquid pump cover 61 (such as FIG. 6), driving the liquid to flow in a closed circulation system. The sealing ring 64 is arranged in a sealing ring installation portion 126 at the opening of the liquid pump installation cavity 122, so that the sealing ring 64 abuts between the sealing ring installation portion 126 and the inner surface of the liquid pump cover 61 to achieve a sealed and anti-leakage effect.

Figure 7:
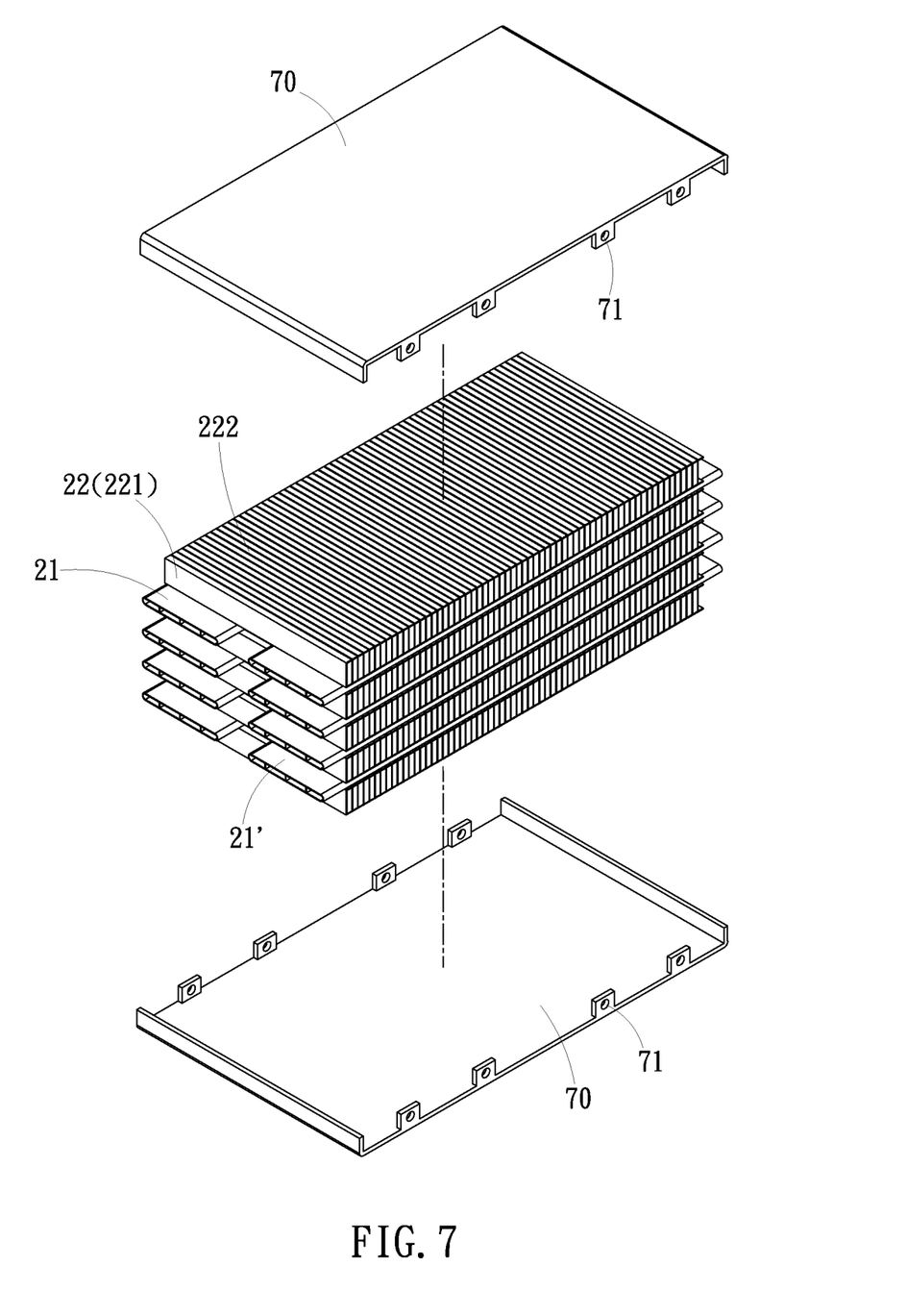
FIG. 7 is an exploded schematic diagram of the heat dissipation pipe set and the fin covers of the present invention.
Figure 8:
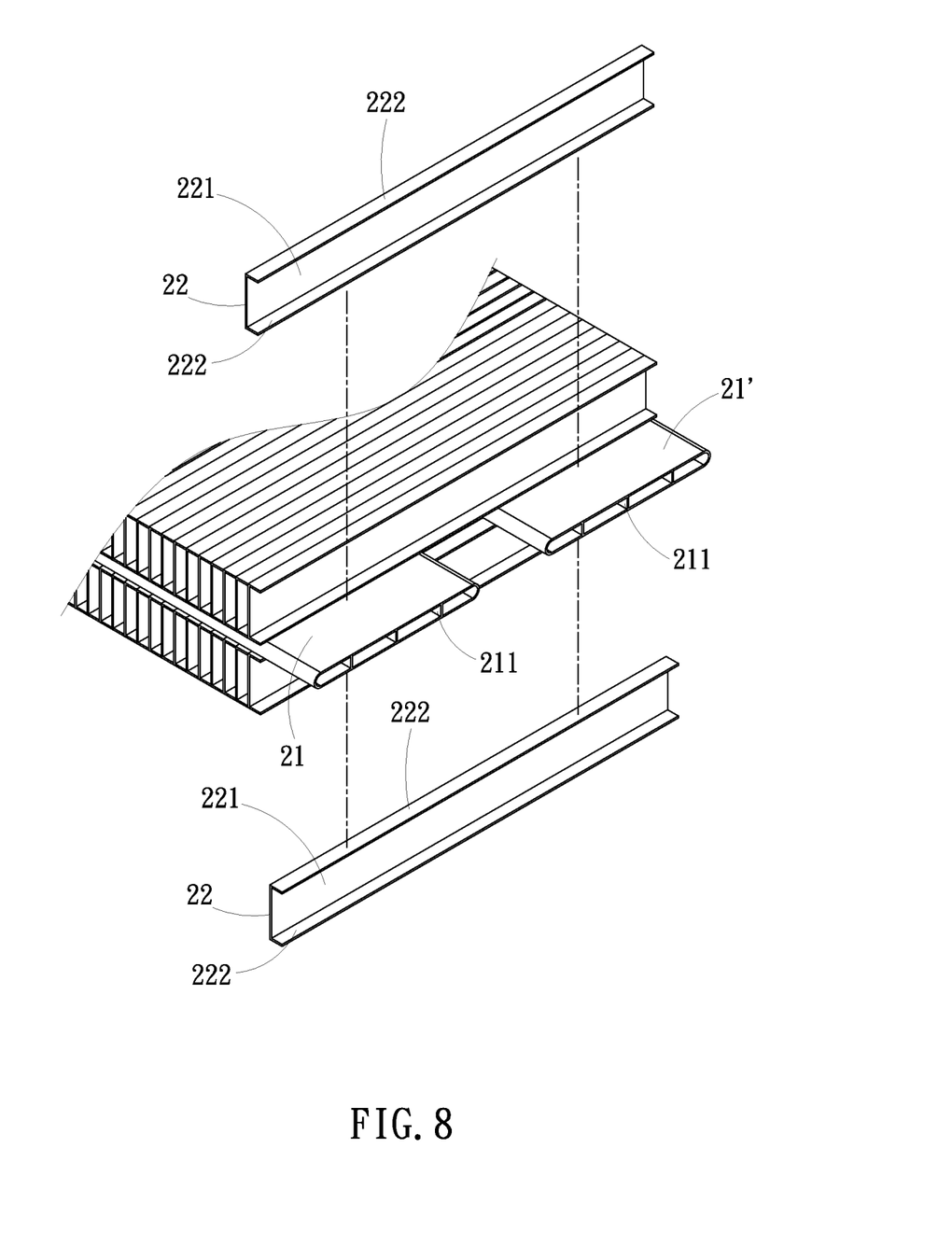
FIG. 8 is an exploded schematic view of the heat dissipation fins and flat pipes of the present invention.

As shown in FIG. 7 and FIG. 8, the two rows of most flat pipes 21, 21' of the heat dissipation pipes set 20 of the present invention are arranged horizontally and vertically at intervals. The width of these heat dissipation fins 22 is equal to the sum of the widths of the two rows of most flat pipes 21, 21'. These heat dissipation fins 22 span and are welded on the upper and lower planes of the two rows of flat pipes 21, 21'. These heat dissipation fins 22 are each integrally formed with a vertical plate 221 and two horizontal plates 222 at the upper and lower ends of the vertical plate 221. The vertical plate 221 and the two horizontal plates 222 are arranged perpendicular to the two rows of flat pipes 21, 21', and the vertical plate 221 is parallel to one side wall 112' of the box body 11. The heat dissipation fins 22 are close to each other, so that the horizontal plates 222 of one heat dissipation fin 22 are against the vertical plate 221 of another adjacent heat dissipation fin 22, and an air inlet end 23 of the heat dissipation pipe set 20 is located on the side of the front side wall 112 of the box body 11, an air outlet end 24 of the heat dissipation pipe set 20 is located on the side of the rear side wall of the box body 11. As shown in FIG. 8, the flat pipes 21, 21' each have a plurality of heat conduction fins 211 connecting the upper and lower pipe walls thereof, which can increase the contact area between the hot liquid and the flat pipes 21, 21' and improve its heat dissipation efficiency.

As shown in FIG. 1, FIG. 3 and FIG. 7, the present invention further comprises two fin covers 70. The width of each fin cover 70 is the same as the total area where the horizontal plates 222 of the heat dissipation fins 22 are side by side and are welded on the horizontal plates 222 of the heat dissipation fins 22 on the upper and lower sides of the heat dissipation pipe set 20. One end of the two fin covers 70 can be assembled with at least one fan 80 (two fans 80 as shown in FIG. 2 and FIG. 3). The fan 80 is locked on the plurality of locking portions 71 at one end of the two fin covers 70 by screws, so that the fan 80 is located beside the front side wall of the box body 11 and sends airflow to the air inlet end 23.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A liquid cooler, comprising a liquid cooling head arranged on a processor, a liquid cooling radiator separated from said liquid cooling head for heat dissipation, and two liquid delivery pipes connected between said liquid cooling head and said liquid cooling radiator, wherein:

said liquid cooling radiator comprises a liquid pump box, a heat dissipation pipe set and a liquid return box, said liquid pump box comprising a box body and a box cover made of metal, said box body being integrally formed with a bottom wall, a front side wall, a rear side wall, a left side wall, a right side wall, an opening and two vertical rows of pipe jacks located on said right side wall of said box body, said heat dissipation pipe set comprising two rows of vertically arranged flat pipes and a plurality of heat dissipation fins welded on upper and lower planes of said flat pipes, each said flat pipe having one end thereof inserted and welded to one respective said pipe jack of said box body, and an opposite end thereof inserted and welded to said liquid return box;

said box body comprises an air barrier space set therein, said air barrier space having one end thereof adjacent to an inner surface of said front side wall of said box body, and an opposite end thereof bent and adjacent to an inner surface of said right side wall of said box body and located between said two rows of pipe jacks, said air barrier space dividing an inside of said box body into a hot liquid inlet chamber and a cold liquid outlet chamber, a space of said hot liquid inlet chamber being smaller than a space of said cold liquid outlet chamber, said hot liquid inlet chamber being connected to one said row of pipe jacks, and said cold liquid outlet chamber being connected to the other said row of pipe jacks, said hot liquid inlet chamber and said cold liquid outlet chamber being isolated from said air barrier space, said front side wall of said box body being provided with a liquid inlet pipe connected to said hot liquid inlet chamber and a liquid outlet pipe connected to said cold liquid outlet chamber;

said air barrier space comprises a hot liquid bending partition and a cold liquid bending partition arranged apart, said hot liquid bending partition and said cold liquid bending partition having respective one ends thereof respectively welded to an inner surface of said front side wall of said box body, respective opposite ends thereof respectively welded to an inner surface of said right side wall of said box body and between said two rows of pipe jacks and respective bottom ends thereof respectively welded to an inner surface of said bottom wall of said box body, so that said air barrier space is formed between said hot liquid bending partition and said cold liquid bending partition; and said box cover covers the opening of said box body to seal said air barrier space, said hot liquid inlet chamber and said cold liquid outlet chamber, said box cover being in close contact with an upper end of said hot liquid bending partition and an upper end of said cold liquid bending partition.

2. The liquid cooler as claimed in claim 1, wherein said air barrier space is an L-shaped bending space and said hot liquid bending partition and said cold liquid bending partition are L-shaped bending partitions respectively.

3. The liquid cooler as claimed in claim 2, further comprising a liquid pump, said liquid pump being selectively set inside said box body of said liquid pump box or inside said box cover of said liquid pump box.

4. The liquid cooler as claimed in claim 3, wherein a liquid pump seat protrudes from the inside of said box cover, and a liquid pump installation cavity is recessed from the outside of said box cover to said liquid pump seat; said liquid pump installation cavity has an end face thereof provided with a liquid inlet hole connected to said cold liquid outlet chamber, and one side thereof provided with a liquid outlet hole connected to said liquid outlet pipe.

5. The liquid cooler as claimed in claim 1, wherein said two rows of flat pipes of said heat dissipation pipe set are arranged horizontally and vertically at intervals; the width of said heat dissipation fins is equal to the sum of the widths of said two rows of flat pipes; said heat dissipation fins are straddled and welded on upper and lower planes of said two rows of flat pipes.

6. The liquid cooler as claimed in claim 5, wherein said heat dissipation fins are each integrally formed with a vertical plate and two horizontal plates at the upper and lower ends of said vertical plate, said vertical plate and said two horizontal plates being arranged perpendicular to said two rows of flat pipes, said vertical plate being parallel to one side wall of said box body, said horizontal plates of said heat dissipation fins being welded on the outer surface of said two rows of flat pipes; said heat dissipation fins being close to each other, so that the horizontal plates of one said heat dissipation fin are against the vertical plate of another adjacent said heat dissipation fin, said heat dissipation pipe set having an air inlet end located on the side of said front side wall of said box body and an air outlet end located on the side of the rear side wall of said box body.

7. The liquid cooler as claimed in claim 5, wherein said flat pipes each comprise a plurality of heat conduction fins connecting upper and lower pipe walls thereof.

8. The liquid cooler as claimed in claim 6, further comprising two fin covers, the width of each said fin cover being the same as the total area of the horizontal plates of said heat dissipation fins side by side, said fin covers being welded to said horizontal plates of said heat dissipation fins on the upper and lower sides of said heat dissipation pipe set.

9. The liquid cooler as claimed in claim 7, further comprising at least one fan, said fan at least one fan being locked to multiple locking portions at one end of said two fin covers by screws, and said fan at least one fan being located beside said front side wall of said box body to send out airflow to said air inlet end.

\* \* \* \* \*